United States Patent
Ota et al.

[11] Patent Number: 5,901,042
[45] Date of Patent: May 4, 1999

[54] PACKAGE AND SEMICONDUCTOR DEVICE

[75] Inventors: Yorito Ota, Hyogo; Masahiro Maeda, Osaka; Shigeru Morimoto, Osaka; Morio Nakamura, Osaka, all of Japan

[73] Assignee: Matsushita Electric Industrial Co., Ltd., Osaka, Japan

[21] Appl. No.: 09/062,752

[22] Filed: Apr. 20, 1998

[30]     Foreign Application Priority Data

Apr. 21, 1997  [JP]  Japan ................................ 9-103450

[51] Int. Cl.⁶ ........................................ H05K 7/20

[52] U.S. Cl. .................... 361/704; 361/707; 361/715; 361/719; 257/706; 257/707; 257/711; 257/713; 257/701

[58] Field of Search ................................ 361/704, 707, 361/709, 711, 718–720, 728, 736, 749; 257/675, 688, 706, 707, 713; 174/52.3, 52.2, 52.4

[56] References Cited

U.S. PATENT DOCUMENTS

| | | | |
|---|---|---|---|
| 4,876,588 | 10/1989 | Miyamoto | 257/706 |
| 5,477,083 | 12/1995 | Kawai | 257/701 |
| 5,485,037 | 1/1996 | Marrs | 257/712 |
| 5,583,377 | 12/1996 | Higgins, III | 257/707 |
| 5,625,228 | 4/1997 | Rogren | 257/712 |
| 5,767,573 | 6/1998 | Noda et al. | 257/675 |

*Primary Examiner*—Leo P. Picard
*Assistant Examiner*—Boris L. Chervinsky
*Attorney, Agent, or Firm*—McDermott, Will & Emery

[57]                ABSTRACT

A semiconductor chip is mounted on the central portion of a metal heat radiator. A pair of metal projecting members are provided on the heat radiator externally of the pair of opposed sides of the semiconductor chip to extend therealong beyond both ends of the semiconductor chip. A circuit board is mounted on the side of each of the pair of projecting members opposed to the semiconductor chip. The top surface of the semiconductor chip and the top surface of each of the projecting members are connected to each other by a third bonding wire for grounding.

9 Claims, 4 Drawing Sheets

PACKAGE AND SEMICONDUCTOR DEVICE

BACKGROUND OF THE INVENTION

The present invention relates to a package for carrying a semiconductor chip for high-power and high-frequency applications and to a semiconductor device composed of the semiconductor chip for high-power and high-frequency applications mounted on the package.

In recent years, there has been increasing demand for high-frequency semiconductor devices such as a MESFET composed of gallium arsenide (GaAs) that has been used more prevalently in consumer products with the development of mobile communication. In the field of the high-frequency semiconductor devices, the use of the microwave or milliwave band as a replacement for the VHF or UHF band has been desired for the achievement of higher-quality communication and effective use of frequencies. To implement a communication system using such a high-frequency band, it is important to develop, as an RF amplifier, a semiconductor device for high-power and high-frequency applications which is easy to mass produce.

However, the conventional high-frequency semiconductor devices using the high-frequency band, such as the GaAs transistor, have been developed exclusively for use in defense industry and other special-purpose application areas. Since mobile communication requires particularly high power, considerably advanced and complicated mounting technology is necessary to apply the high-frequency semiconductor devices to the field of mobile communication, which presents a serious problem associated with the mass-producibility of the semiconductor devices.

Referring to the drawings, a conventional semiconductor device composed of a semiconductor chip for high-power and high-frequency applications mounted on a package will be described.

FIGS. 4 illustrate the structure of the conventional semiconductor device composed of the semiconductor chip for high-power and high-frequency applications mounted on the package, of which FIG. 4(a) shows a plan structure and FIG. 4(b) shows a cross-sectional structure.

As shown in FIGS. 4(a) and 4(b), two semiconductor chips 11 including transistors for high-power and high-output applications, such as MESFETs formed on a GaAs substrate, are mounted on the central portion of a heat radiator 10 made of metal such as copper, which is to serve as a heat sink. On both sides of each of the semiconductor chips 11, two circuit boards 12 made of ceramic or the like are mounted on the heat radiator 10. On each of the circuit boards 12, there are formed a power distributing/synthesizing circuit, an I/O impedance matching circuit for the transistor, and surface wiring for providing connection between the power distributing/synthesizing circuit and the I/O impedance matching circuit.

On the left edge portion of the heat radiator 10, an input lead 13 and an input wiring pad 14 integrally formed with the input lead 13 are disposed via an insulator 15. On the right edge portion of the heat radiator 10, an output lead 16 and an output wiring pad 17 integrally formed with the output lead 16 are disposed via the insulator 15.

The semiconductor chips 11 and the circuit boards 12 are connected to each other by first bonding wires 18 for signal transmission. The circuit boards 12 and the input wiring pad 14 are connected to each other by second bonding wires 19 for signal transmission, while the circuit boards 12 and the output wiring pad 17 are also connected to each other by the second bonding wires 19 for signal transmission. A surrounding wall member 20 made of ceramic or the like and shaped like a square frame is formed on the input and output leads 13 and 16 overlying the insulators 15. It is to be noted that the input and output leads 13 and 16 extend through respective cut-away portions formed in the surrounding wall member 20.

FIG. 4(c) shows a cross-sectional structure of a portion different from the one shown in FIG. 4(b) of the semiconductor chip 11. A MESFET 23 made of GaAs is formed in the surface region of the semiconductor chip 11. The MESFET 23 has a drain connected to the first bonding wire 18 and a source connected to a gold plating layer 22 formed on the back face of the semiconductor chip 11 via a conductive material filled in a via hole 21 extending through the semiconductor chip 11. The purpose of connecting the source of the MESFET 23 to the gold plating layer 22 via the conductive material filled in the via hole 21 is to reduce a grounding line and thereby prevent the deterioration of the high-frequency gain of the MESFET 23.

In the case of forming a high-power transistor on the semiconductor chip 11, the thickness of the semiconductor chip 11 should be reduced to the order of several tens of micrometers so as to reduce thermal resistance in the semiconductor chip 11 in transmitting heat generated from the high-power transistor to the heat radiator 10. In short, the thickness of the semiconductor chip 11 formed with the high-power transistor should be reduced significantly.

This leads to the problems that an advanced manufacturing technique is required to form the via hole 21 in the semiconductor chip 11 and that the production yield lowers during the processing of the semiconductor chip 11.

In the case where numerous via holes 21 are formed in the semiconductor chip 11 with an extremely reduced thickness, the semiconductor chip 11 to be mounted on the heat radiator 10 should be handled with extreme caution and attentiveness because of its reduced mechanical strength, while the cracking of the semiconductor chip 11 lowers the production yield during the mounting of the semiconductor chip 11.

In the case where the semiconductor chip 11 is made of a fragile material such as GaAs, in particular, the lowering of the production yield during the processing and mounting of the semiconductor chip 11, as described above, presents an extremely serious problem.

SUMMARY OF THE INVENTION

In view of the foregoing, it is therefore an object of the present invention to reduce the length of a grounding line extending from a semiconductor chip without forming a via hole in the semiconductor chip.

To attain the above object, the present invention has eliminated the necessity for forming the via hole for grounding in the semiconductor chip by providing a heat radiator with a metal projecting member on either side of the semiconductor chip and by connecting the grounding side of the semiconductor chip to the projecting member via a bonding wire.

A first package according to the present invention is a package for carrying a semiconductor chip, comprising: a metal heat radiator having a square chip carrying region to be provided with the semiconductor chip; and a pair of metal projecting members provided on the heat radiator externally of a pair of opposed sides of the chip carrying region to extend therealong beyond both ends of the semiconductor chip.

In the first package, the pair of metal projecting members are provided on the metal heat radiator externally of the pair of opposed sides of the chip carrying region to extend therealong beyond the both ends of the semiconductor chip. Consequently, it becomes possible to connect the semiconductor chip mounted on the chip carrying region to the metal projecting members by the bonding wire for grounding. This permits a grounding line to be connected to the semiconductor chip without forming a via hole in the semiconductor chip mounted on the chip carrying region.

Moreover, since a soldering material or an adhesive used for bonding the semiconductor chip to the chip carrying region of the heat radiator is prevented from encroaching on another region of the heat radiator, the spacing between a circuit board mounted on the other region of the heat radiator and the semiconductor chip can be reduced, resulting in a heat radiator reduced in area.

A second package according to the present invention is a package for carrying a semiconductor chip, comprising: a metal heat radiator; and a metal chip carrier provided on the heat radiator, the chip carrier being composed of a bottom portion sufficiently large in size to carry the semiconductor chip and a pair of sidewall portions formed on both side edge portions of the bottom portion to have a recessed cross section.

In the second package, the metal chip carrier composed of the bottom portion sufficiently large in size to carry the semiconductor chip and the pair of sidewall portions formed on both side edge portions of the bottom portion to have the recessed cross section is provided on the metal heat radiator. Consequently, it becomes possible to connect the semiconductor chip mounted on the bottom portion of the chip carrier to each of the sidewall portions of the chip carrier by the bonding wire for grounding. This permits a grounding line to be connected to the semiconductor chip without forming a via hole in the semiconductor chip mounted on the chip carrier.

Moreover, since a soldering material or an adhesive used for bonding the semiconductor chip to the bottom portion of the chip carrier is prevented from encroaching on another region of the heat radiator, the spacing between a circuit board mounted on the other region of the heat radiator and the semiconductor chip can be reduced, resulting in a heat radiator reduced in area.

A third package according to the present invention is a package for carrying a semiconductor chip, comprising: a metal heat radiator having a square chip carrying region to be provided with the semiconductor chip; a metal projecting member provided on the heat radiator externally of one of a pair of opposed sides of the chip carrying region to extend therealong beyond both ends of the semiconductor chip; and a groove formed in the heat radiator externally of the other of the pair of opposed sides of the chip carrying region to extend therealong beyond both ends of the semiconductor chip.

In the third package, the projecting member is provided on the metal heat radiator externally of one of the pair of opposed sides of the chip carrying region to extend therealong beyond the both ends of the semiconductor chip. Consequently, it becomes possible to connect the metal projecting member to the semiconductor chip mounted on the chip carrying region by the bonding wire for grounding. This permits a grounding line to be connected to the semiconductor chip without forming a via hole in the semiconductor chip mounted on the chip carrying region.

Moreover, since a soldering material or an adhesive used for bonding the semiconductor chip to the chip carrying region of the heat radiator is prevented from encroaching on another region of the heat radiator, the spacing between the circuit board mounted on the other region of the radiator and the semiconductor chip can be reduced, resulting in a heat radiator reduced in area.

A first semiconductor device according to the present invention comprises: a metal heat radiator; a semiconductor chip mounted on the heat radiator; a pair of projecting members provided on the heat radiator externally of a pair of opposed sides of the semiconductor chip to extend therealong beyond both ends of the semiconductor chip; and a bonding wire for grounding, the bonding wire providing electrical connection between a top surface of the semiconductor chip and a top surface of each of the pair of projecting members.

In the first semiconductor device, the metal projecting members are provided externally of the pair of opposed sides of the semiconductor chip mounted on the heat radiator to extend therealong beyond the both ends of the semiconductor chip. Consequently, the semiconductor chip is connected to each of the projecting members by the bonding wire for grounding. This permits a grounding line to be connected to the semiconductor chip without forming a via hole in the semiconductor chip and prevents the deterioration of the high-frequency gain of an high-frequency transistor formed on the semiconductor chip.

Moreover, since a soldering material or an adhesive used for bonding the semiconductor chip to the heat radiator is prevented from encroaching on another region of the heat radiator, the spacing between the circuit board mounted on the other region of the heat radiator and the semiconductor chip can be reduced, resulting in a further miniaturized heat radiator and a further miniaturized semiconductor device.

Preferably, the first semiconductor device further comprises: a circuit board mounted on the heat radiator to be located on the side of one of the pair of projecting members opposed to the semiconductor chip; and a bonding wire for signal transmission, the bonding wire providing electrical connection between the top surface of the semiconductor chip and a top surface of the circuit board.

The arrangement can prevent a soldering material or an adhesive used for bonding the semiconductor chip or the circuit board to the heat radiator from encroaching on the region of the heat radiator to which the circuit board or semiconductor chip is bonded, so that the spacing between the circuit board and the semiconductor chip is reduced. This allows the semiconductor device as well as the heat radiator to be further miniaturized.

A second semiconductor device according to the present invention comprises: a metal heat radiator; a metal chip carrier provided on the heat radiator, the chip carrier being composed of a bottom portion sufficiently large in size to carry the semiconductor chip and a pair of sidewall portions formed on both side edge portions of the bottom portion to have a recessed cross section; a semiconductor chip mounted on the bottom portion of the chip carrier; and a bonding wire for grounding, the bonding wire providing electrical connection between a top surface of the semiconductor chip and a top surface of each of the pair of sidewall portions of the chip carrier.

In the second semiconductor device, the semiconductor chip is mounted on the bottom portion of the metal chip carrier provided on the heat radiator so that the semiconductor chip is connected to each of the sidewall portions of the chip carrier by the bonding wire. This permits a grounding line to be connected to the semiconductor chip without forming a via hole in the semiconductor chip and prevents the deterioration of the high-frequency gain of an high-frequency transistor formed on the semiconductor chip.

Moreover, since a soldering material or an adhesive used for bonding the semiconductor chip to the heat radiator is prevented from encroaching on another region of the heat radiator, the spacing between the circuit board mounted on the other region of the heat radiator and the semiconductor chip can be reduced, resulting in a further miniaturized heat radiator and a further miniaturized semiconductor device.

Furthermore, since the chip carrier can be manufactured independently of the heat radiator, the chip carrier with the semiconductor chip mounted thereon can constitute a separate and distinct semiconductor chip component. By screening the semiconductor chip components to sort out the defective products, therefore, the overall assembly yield can be improved, resulting in lower cost for manufacturing the semiconductor device.

Preferably, the second semiconductor device further comprises: a circuit board mounted on the heat radiator externally of one of the pair of sidewall portions of the chip carrier; and a bonding wire for signal transmission, the bonding wire providing electrical connection between the top surface of the semiconductor chip and a top surface of the circuit board.

The arrangement can prevent a soldering material or an adhesive used for bonding the semiconductor chip or the circuit board from encroaching on the region of the heat radiator to which the circuit board or semiconductor chip is bonded, so that the spacing between the circuit board and the semiconductor chip is reduced. This allows the semiconductor device as well as the heat radiator to be further miniaturized.

A third semiconductor device according to the present invention comprises: a metal heat radiator; a semiconductor chip mounted on the heat radiator; a metal projecting member provided on the heat radiator externally of one of a pair of opposed sides of the semiconductor chip to extend therealong beyond both ends of the semiconductor chip; a groove formed in the heat radiator externally of the other of the pair of opposed sides of the semiconductor chip to extend therealong beyond the both ends of the semiconductor chip; and a bonding wire for grounding, the bonding wire providing electrical connection between a top surface of the semiconductor chip and a top surface of the projecting member.

In the third semiconductor device, the metal projecting member is provided on the heat radiator externally of one of the pair of opposed sides of the semiconductor chip mounted thereon to extend therealong beyond the both ends of the semiconductor chip. Consequently, it becomes possible to connect the semiconductor chip to the projecting member by the bonding wire for grounding. This permits a grounding line to be connected to the semiconductor chip without forming a via hole in the semiconductor chip and prevents the deterioration of the high-frequency gain of an high-frequency transistor formed on the semiconductor chip.

Moreover, since a soldering material or an adhesive used to bond the semiconductor chip to the heat radiator is prevented from encroaching on another region of the heat radiator, the spacing between the circuit board mounted on the other region of the heat radiator and the semiconductor chip can be reduced, resulting in a further miniaturized heat radiator and a further miniaturized semiconductor device.

Preferably, the third semiconductor device further comprises: a circuit board mounted on the heat radiator to be located on the side of the groove opposed to the semiconductor chip; and a bonding wire for signal transmission, the bonding wire providing electrical connection between the top surface of the semiconductor chip and a top surface of the circuit board.

Preferably, the third semiconductor device further comprises: a circuit board mounted on the heat radiator to be located on the side of the projecting member opposed to the semiconductor chip; and a bonding wire for signal transmission, the bonding wire providing electrical connection between the top surface of the semiconductor chip and a top surface of the circuit board.

If the third semiconductor device comprises the foregoing circuit board and bonding wire, a soldering material or an adhesive used for bonding the semiconductor chip or the circuit board to the heat radiator is prevented from encroaching on the region of the heat radiator to which the circuit board or semiconductor chip is to be bonded, so that the spacing between the circuit board and the semiconductor chip is reduced. This allows the semiconductor device as well as the heat radiator to be further miniaturized.

As described above, the first to third semiconductor devices eliminates the necessity for forming a via hole which reduces the mechanical strength of the semiconductor chip, so that the mass-producibility of the semiconductor device is improved significantly.

BRIEF DESCRIPTION OF THE DRAWINGS

FIG. 1 illustrate a package and a semiconductor device according to a first embodiment of the present invention, of which

FIG. 2 illustrate a package and a semiconductor device according to a second embodiment of the present invention, of which

FIG. 3 illustrate a package and a semiconductor device according to a third embodiment of the present invention, of which FIG. 4 show a conventional semiconductor device, of which

DETAILED DESCRIPTION OF THE INVENTION

EMBODIMENT 1

Figure 1A:
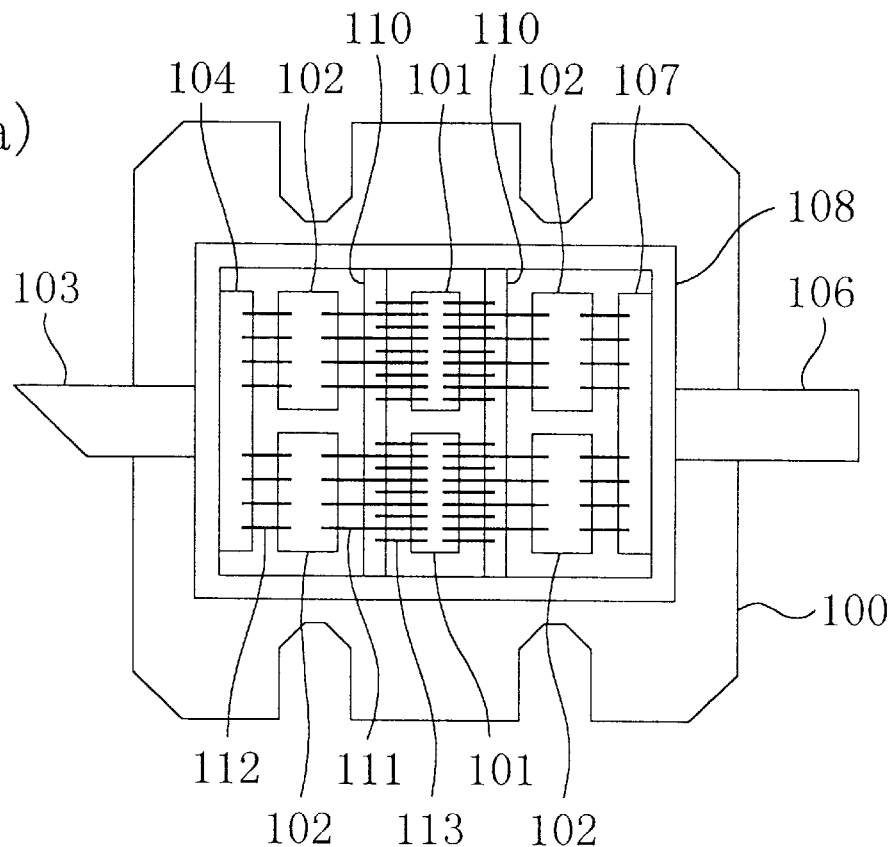
FIG. 1(a) is a plan view of the semiconductor device and FIG. 1(b) is a cross-sectional view thereof.
Figure 1B:
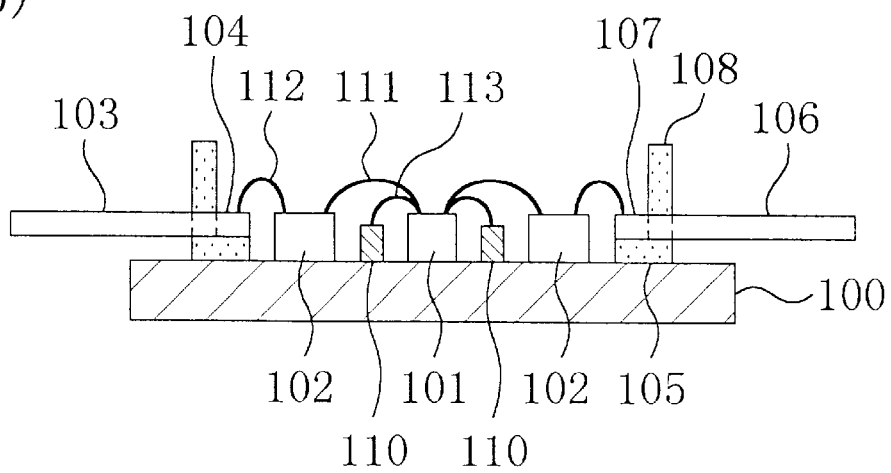

FIG. 1 illustrate a package and a semiconductor device according to a first embodiment of the present invention, of which FIG. 1(a) shows a plan structure of the semiconductor device and FIG. 1(b) shows a cross-sectional structure thereof.

As shown in FIGS. 1(a) and 1(b), two semiconductor chips 101 including transistors for high-power and high-output applications, such as MESFETs formed on a GaAs substrate, are mounted on the central portion of a heat radiator 100 made of metal such as copper, which is to serve as a heat sink. On both sides of each of the semiconductor chips 101, two circuit boards 102 made of ceramic or the like are mounted on the heat radiator 100. On each of the circuit boards 102, there are formed a power distributing/synthesizing circuit, an I/O impedance matching circuit for the transistor, and surface wiring for providing connection between the power distributing/synthesizing circuit and the I/O impedance matching circuit. It is also possible to compose the circuit board 102 of a GaAs substrate and form transistors (such as MESFETs) on the surface of the GaAs substrate.

On the left edge portion of the heat radiator 100, an input lead 103 and an input wiring pad 104 integrally formed with the input lead 103 are disposed via an insulator 105, which is made of ceramic or the like and shaped like a square frame. On the right edge portion of the heat radiator 100, an output lead 106 and an output wiring pad 107 integrally formed with the output lead 106 are disposed via the insulator 105. A surrounding wall member 108 made of ceramic or the like and shaped like a square frame is formed on the input and output leads 103 and 106 overlying the insulators 105. In this case, the input and output leads 103 and 106 extends through respective cut-away portions formed in the surrounding wall member 108.

The first embodiment is characterized in that a pair of projecting members 110 made of metal such as copper are provided on the heat radiator 100 externally of the semiconductor chip 101, i.e., between the semiconductor chips 101 and the right and left circuit boards 102 to extend along the sides of the semiconductor chips 101 beyond the outer ends of the respective semiconductor chips 101. To provide the projecting members 110, the surface region of the heat radiator 100 may be scraped away except for the portions to be formed with the projecting members 110 or metal linear members may be bonded to the surface of the heat radiator 100 by soldering or like technique.

The surfaces of the semiconductor chips 101 and the surfaces of the circuit boards 102 are connected to each other by first bonding wires 111 for signal transmission. The circuit boards 102 and the input wiring pad 104 are connected to each other by second bonding wires 112 for signal transmission, while the circuit boards 102 and the output wiring pad 106 are also connected to each other by the second bonding wires 112 for signal transmission. On the other hand, grounding electrodes formed on the respective surfaces of the semiconductor chips 101 and the projecting members 110 are connected to each other by third bonding wires 113 for grounding.

According to the first embodiment, since the pair of projecting members 110 are provided on the heat radiator 100 externally of the semiconductor chips 101 to extend along the respective sides thereof and the top surfaces of the semiconductor chips 101 and the top surfaces of the projecting members 110 are connected to each other by the third bonding wires 113 for grounding, shorter grounding lines are implemented without forming via holes in the semiconductor chips 101, which prevents the deterioration of the high-frequency gains of the high-frequency transistors formed on the semiconductor chips 101.

Moreover, since the projecting members 110 are provided between the semiconductor chips 101 and the circuit boards 102 to extend along the sides of the semiconductor chips 101 beyond the outer ends of the respective semiconductor chips 101, they prevent a soldering material or an adhesive applied to a chip or board carrying region for bonding the semiconductor chip 101 or the circuit board 102 to the heat radiator 100 from encroaching on an adjacent chip or board carrying region, resulting in a reduced spacing between the semiconductor chip 101 and the circuit board 102. Consequently, the heat radiator 100 can be reduced in size compared with the conventional heat radiator.

A description will be given to a method of mounting the semiconductor chips 101 and the circuit boards 102 on the heat radiator 100.

First, a package including the heat radiator 100 formed with the projecting members 110 is prepared. On the heat radiator 100, projecting members 110 extend between the chip carrying region to be provided with the semiconductor chips 101 and the board carrying regions to be provided with the circuit boards 102 along the pair of opposed sides of the chip carrying region beyond the outer ends of the respective semiconductor chips 101.

Then, the semiconductor chips 101 are bonded to the chip carrying region of the heat radiator 100 of the package by using a soldering material, while the circuit boards 102 are bonded to the board carrying regions of the heat radiator 100 by using an adhesive.

EMBODIMENT 2

Figure 2A:
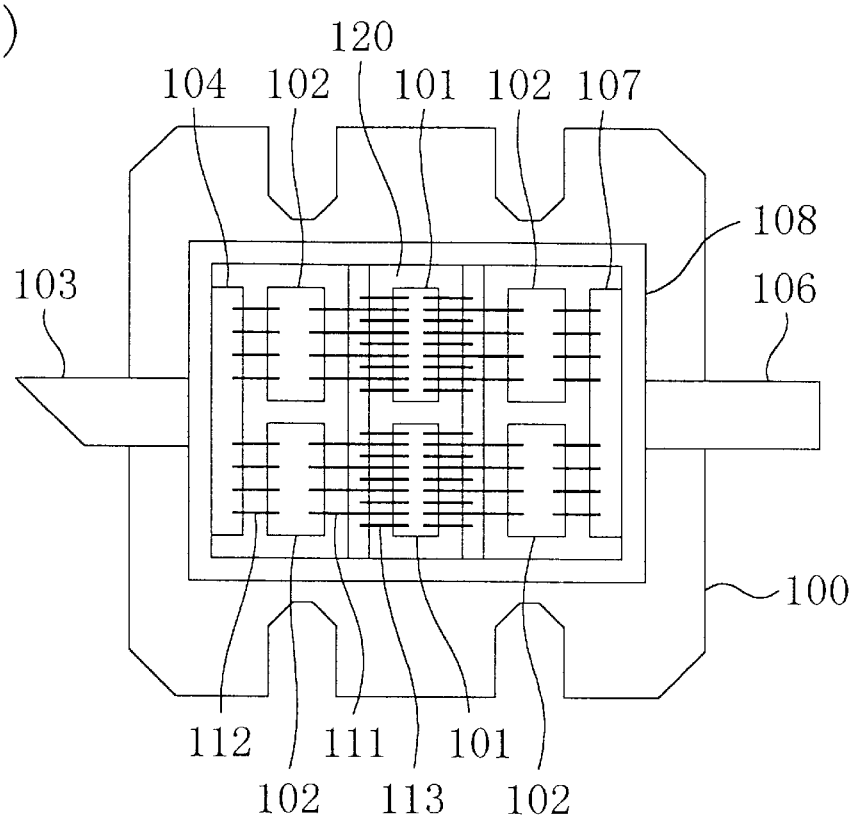
FIG. 2(a) is a plan view of the semiconductor device and FIG. 2(b) is a cross-sectional view thereof.
Figure 2B:
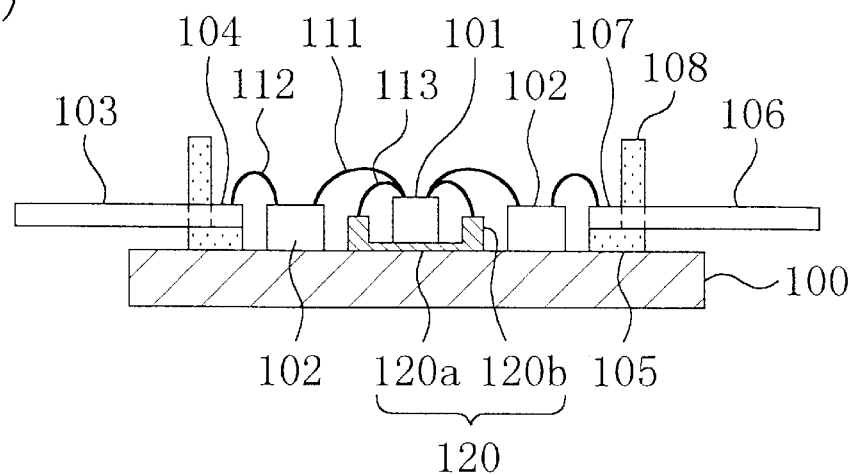

FIG. 2 illustrate a package and a semiconductor device according to a second embodiment of the present invention, of which FIG. 2(a) shows a plan structure of the semiconductor device and FIG. 2(b) shows a cross-sectional structure thereof.

In the second embodiment also, two semiconductor chips 101 are mounted on the central portion of a heat radiator 100. On both sides of each of the semiconductor chips 101, two circuit boards 102 are mounted on the heat radiator 100, similarly to the first embodiment.

On the left edge portion of the heat radiator 100, an input lead 103 and an input wiring pad 104 are disposed via an insulator 105. On the right edge portion of the heat radiator 100, an output lead 106 and an output wiring pad 107 are disposed via the insulator 105. A surrounding wall member 108 shaped like a square frame is formed on the input and output leads 103 and 106 overlying the insulators 105.

The second embodiment is characterized in that a chip carrier 120 made of metal such as copper and having a recessed cross section is formed on the chip carrying region of the heat radiator 100. The chip carrier 120 consists of a bottom portion 120a sufficiently large in size to carry the semiconductor chips 101 and a pair of projecting members 120b extending along the sides of the bottom portion 120a. The semiconductor chips 101 are disposed on the bottom portion 120a of the chip carrier 120. The chip carrier 120 may be formed of a thin strip material processed by press molding to have the recessed cross section or of a thick strip material having a central portion scraped away in the longitudinal direction thereof to have the recessed cross section.

The surfaces of the semiconductor chips 101 and the surfaces of the circuit boards 102 are connected to each other by first bonding wires 111 for signal transmission, similarly to the first embodiment. The circuit boards 102 and the input wiring pad 104 are connected to each other by second bonding wires 112 for signal transmission, while the circuit boards 102 are also connected to the output wiring pad 107 by the second bonding wires 112 for signal transmission, similarly to the first embodiment. On the other hand, grounding electrodes formed on the respective surfaces of the semiconductor chips 101 and the projecting members 120b of the chip carrier 120 are connected to each other by third bonding wires 113 for grounding.

According to the second embodiment, since the chip carrier 120 consisting of the bottom portion 120a and the projecting members 120 formed on both sides thereof to have the recessed cross section is provided on the heat radiator 100 such that the semiconductor chips 101 are disposed on the bottom portion 120a of the chip carrier 120 and that the top surfaces of the semiconductor chips 101 and the top surfaces of the projecting members 120b are connected to each other by the third bonding wires 113 for grounding, shorter grounding lines are implemented without forming via holes in the semiconductor chips 101, which prevents the deterioration of the high-frequency gains of the high-frequency transistors formed on the semiconductor chips 101. Moreover, since the projecting members 120b of the chip carrier 120 prevent a soldering material or an adhesive applied to a chip or board carrying region for bonding the semiconductor chip 101 or the circuit board 102 to the heat radiator 100 from encroaching on an adjacent chip or board carrying region, the spacing between the semiconductor chip 101 and the circuit board 102 is reduced, resulting in the heat radiator 100 smaller in size than in the conventional embodiment.

To mount the semiconductor chips 101 and the circuit boards 102 on the heat radiator 100, a package is prepared by fixing, by using a soldering material or the like, the chip carrier 120 consisting of the bottom portion 120a and the projecting members 120b formed on both sides thereof to have the recessed cross section to the chip carrying region of the heat radiator 100 to be provided with the semiconductor chips 101. Thereafter, the semiconductor chips 101 are bonded to the bottom portion 120a of the chip carrier 120 by using a soldering material, while the circuit boards 102 are bonded to the board carrying regions of the heat radiator 100 by using an adhesive.

EMBODIMENT 3

Figure 3A:
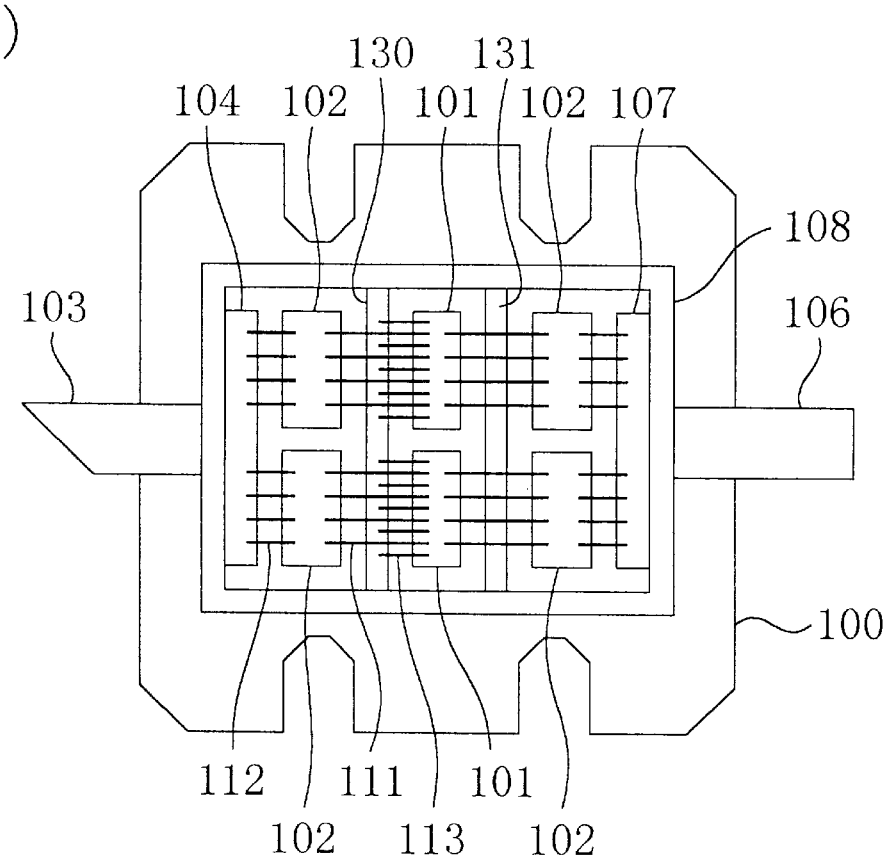
FIG. 3(a) is a plan view of the semiconductor device and FIG. 3(b) is a cross-sectional view thereof.
Figure 3B:
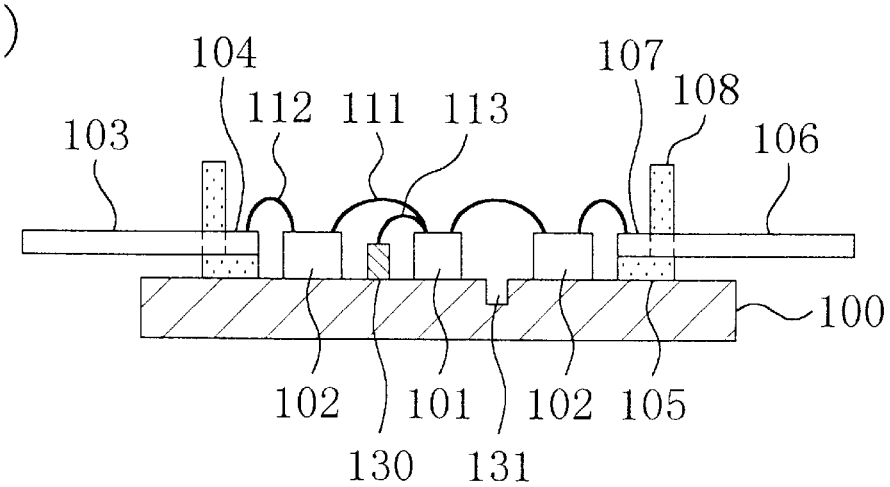
Figure 4A:
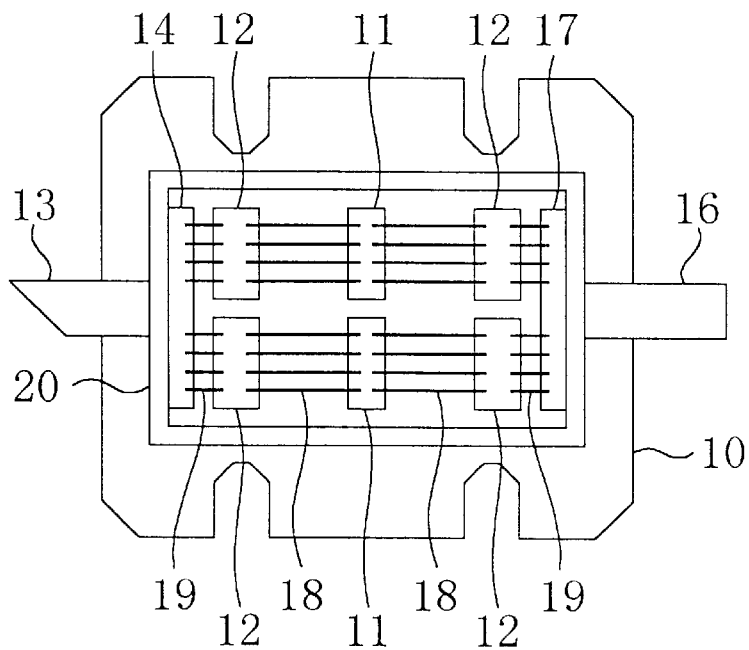
FIG. 4(a) is a plan view of the semiconductor device.
Figure 4B:
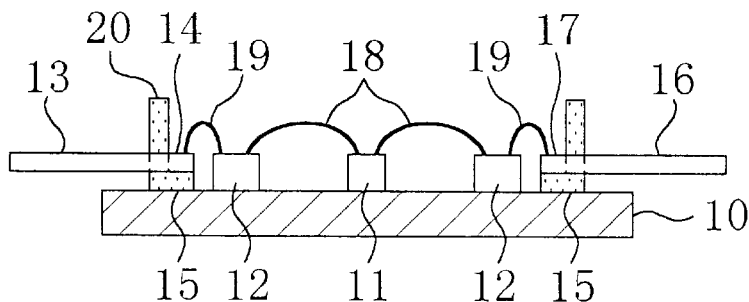
FIG. 4(b) is a cross sectional view thereof.
Figure 4C:
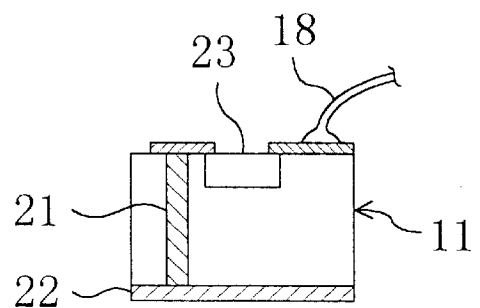
FIG. 4(c) is a cross-sectional view of a semiconductor chip mounted on the conventional semiconductor device.

FIGS. 3 illustrate a package and a semiconductor device according to a third embodiment of the present invention, of which FIG. 3(*a*) shows a plan structure of the semiconductor device and FIG. 3(*b*) shows a cross-sectional structure thereof.

In the third embodiment also, two semiconductor chips 101 are mounted on the central portion of a heat radiator 100. On both sides of the semiconductor chips 101, two circuit boards 102 are mounted on the heat radiator 100, similarly to the first embodiment.

On the left edge portion of the heat radiator 100, an input lead 103 and an input wiring pad 104 are disposed via an insulator 105. On the right edge portion of the heat radiator 100, an output lead 106 and an output wiring pad 107 are disposed via the insulator 105. A surrounding wall member 108 shaped like a square frame is formed on the input and output leads 103 and 106 overlying the insulators 105.

The third embodiment is characterized in that a projecting member 130 made of metal such as copper is provided on the heat radiator 100 to extend between semiconductor chips 101 and the left-hand circuit boards 102 along the sides of the semiconductor chips 101 beyond the outer ends of the respective semiconductor chips 101, while a groove 131 is formed in the heat radiator 100 to extend between the semiconductor chips 101 and the right-hand circuit boards 102 along the sides of the semiconductor chips 101 beyond the outer ends of the respective semiconductor chips 101. To provide the projecting member 130, the surface region of the heat radiator 100 may be scraped away except for the portion to be formed with the projecting member 130 or a metal linear member may be bonded to the surface of the heat radiator 100 by soldering or like technique. To form the groove 131, it is preferred to linearly cut away the surface region of the heat radiator 100.

The surfaces of the semiconductor chips 101 and the surfaces of the circuit boards 102 are connected to each other by first bonding wires 111 for signal transmission. The circuit boards 102 and the input wiring pad 104 are connected to each other by second bonding wires 112 for signal transmission, while the circuit boards 102 and the output wiring pad 107 are also connected to each other by the second bonding wires 112. On the other hand, grounding electrodes formed on the respective surfaces of the semiconductor chips 101 and the projecting member 130 are connected to each other by third bonding wires 113 for grounding.

According to the third embodiment, since the projecting member 130 is provided on the heat radiator 100 to extend externally of the semiconductor chips 101 along the sides thereof and the top surfaces of the semiconductor chips 101 and the top surface of the projecting member 130 are connected to each other by the third bonding wires 113, shorter grounding lines are implemented without forming via holes in the semiconductor chips 101.

Moreover, since the groove 131 has been formed between the semiconductor chips 101 and the right-hand circuit boards 102 in addition to the projecting member 130 provided between the semiconductor chips 101 and the left-hand circuit boards 102, they prevent a soldering material or an adhesive applied to a chip or board carrying region for bonding the semiconductor chip 101 or the circuit board 102 to the heat radiator 100 from encroaching on an adjacent chip or board carrying region, resulting in the heat radiator 100 smaller in size than in the conventional embodiment.

Furthermore, processing cost can be reduced significantly by the groove 131 formed instead of the projecting member 130 on the side of the semiconductor chips 101 not connected to the third bonding wires 113 for grounding, resulting in reduced cost for manufacturing the package.

What is claimed is:

1. A package for carrying a semiconductor chip, comprising:

a metal heat radiator having a square chip carrying region to be provided with said semiconductor chip;

a wall enclosing said chip carrying region mounted on said metal heat radiator; and a pair of metal projecting members provided on said heat radiator and positioned between said semiconductor chip and said wall enclosing said chip carrying region.

2. A package for carrying a semiconductor chip, comprising:

a metal heat radiator having a square chip carrying region to be provided with said semiconductor chip;

a wall enclosing said chip carrying region mounted on said metal heat radiator:

a metal projecting member provided on said heat radiator and positioned between said semiconductor chip and said wall enclosing said chip carrying region; and a groove formed in said heat radiator and positioned between said semiconductor chip and said wall enclosing said chip carrying region.

3. A semiconductor device comprising:

a metal heat radiator;

a semiconductor chip mounted on said heat radiator;

a pair of projecting members provided on said heat radiator externally of a pair of opposed sides of said semiconductor chip to extend therealong beyond both ends of said semiconductor chip; and a bonding wire for grounding, said bonding wire providing electrical connection between a top surface of said semiconductor chip and a top surface of each of said pair of projecting members.

4. A semiconductor device according to claim 3, further comprising:

a circuit board mounted on said heat radiator to be located on the side of one of said pair of projecting members opposed to said semiconductor chip; and a bonding wire for signal transmission, said bonding wire providing electrical connection between the top surface of said semiconductor chip and a top surface of said circuit board.

5. A semiconductor device comprising:

a metal heat radiator;

a metal chip carrier provided on said heat radiator, said chip carrier being composed of a bottom portion sufficiently large in size to carry said semiconductor chip and a pair of sidewall portions formed on both side edge portions of said bottom portion to have a recessed cross section;

a semiconductor chip mounted on said bottom portion of said chip carrier; and a bonding wire for grounding, said bonding wire providing electrical connection between a top surface of said semiconductor chip and a top surface of each of said pair of sidewall portions of said chip carrier.

6. A semiconductor device according to claim 5, further comprising:

a circuit board mounted on said heat radiator externally of one of said pair of sidewall portions of said chip carrier; and a bonding wire for signal transmission, said bonding wire providing electrical connection between the top surface of said semiconductor chip and a top surface of said circuit board.

7. A semiconductor device comprising:

a metal heat radiator;

a semiconductor chip mounted on said heat radiator;

a metal projecting member provided on said heat radiator externally of one of a pair of opposed sides of said semiconductor chip to extend therealong beyond both ends of said semiconductor chip;

a groove formed in said heat radiator externally of the other of said pair of opposed sides of said semiconductor chip to extend therealong beyond the both ends of said semiconductor chip; and a bonding wire for grounding, said bonding wire providing electrical connection between a top surface of said semiconductor chip and a top surface of said projecting member.

8. A semiconductor device according to claim 7, further comprising:

a circuit board mounted on said heat radiator to be located on the side of said groove opposed to said semiconductor chip; and a bonding wire for signal transmission, said bonding wire providing electrical connection between the top surface of said semiconductor chip and a top surface of said circuit board.

9. A semiconductor device according to claim 7, further comprising:

a circuit board mounted on said heat radiator to be located on the side of said projecting member opposed to said semiconductor chip; and a bonding wire for signal transmission, said bonding wire providing electrical connection between the top surface of said semiconductor chip and a top surface of said circuit board.

* * * * *